United States Patent [19]

Mase et al.

[11] Patent Number: 5,100,476
[45] Date of Patent: Mar. 31, 1992

[54] METHOD AND APPARATUS FOR CLEANING SEMICONDUCTOR DEVICES

[75] Inventors: Yasukazu Mase, Fujisawa; Osamu Hirata, Kawasaki; Masahiro Abe, Yokohama, all of Japan

[73] Assignee: Kabushiki Kaisha Toshiba, Kawasaki, Japan

[21] Appl. No.: 499,643

[22] Filed: Mar. 27, 1990

[30] Foreign Application Priority Data

Mar. 30, 1989 [JP] Japan .................................. 1-79139

[51] Int. Cl.[5] .................. H01L 21/463; H01L 21/304
[52] U.S. Cl. ............................................ 134/1; 134/184
[58] Field of Search ............................... 134/1, 184

[56] References Cited

U.S. PATENT DOCUMENTS

| | | | |
|---|---|---|---|
| 4,339,340 | 7/1982 | Muraoka et al. | 134/34 |
| 4,686,002 | 8/1987 | Tasset | 134/34 |
| 4,902,350 | 2/1990 | Steck | 134/1 |
| 4,940,494 | 7/1990 | Petit et al. | 134/1 |
| 4,980,300 | 12/1990 | Miyashita et al. | 134/1 |

FOREIGN PATENT DOCUMENTS 0111337 4/1989 Japan ..................................... 134/1

*Primary Examiner*—Asok Pal
*Attorney, Agent, or Firm*—Finnegan, Henderson, Farabow, Garrett, and Dunner

[57] ABSTRACT

An apparatus for cleaning semiconductor devices has a mixing section for mixing a chemical solution with pure water. A semiconductor substrate to be cleaned is placed on a support. An ultrasonic generator applies ultrasonic vibrations to the supplied pure water. The mixing section mixes a predetermined chemical solution with the pure water applied with the ultrasonic vibrations and supplies a desired pure water solution onto the semiconductor substrate.

20 Claims, 2 Drawing Sheets

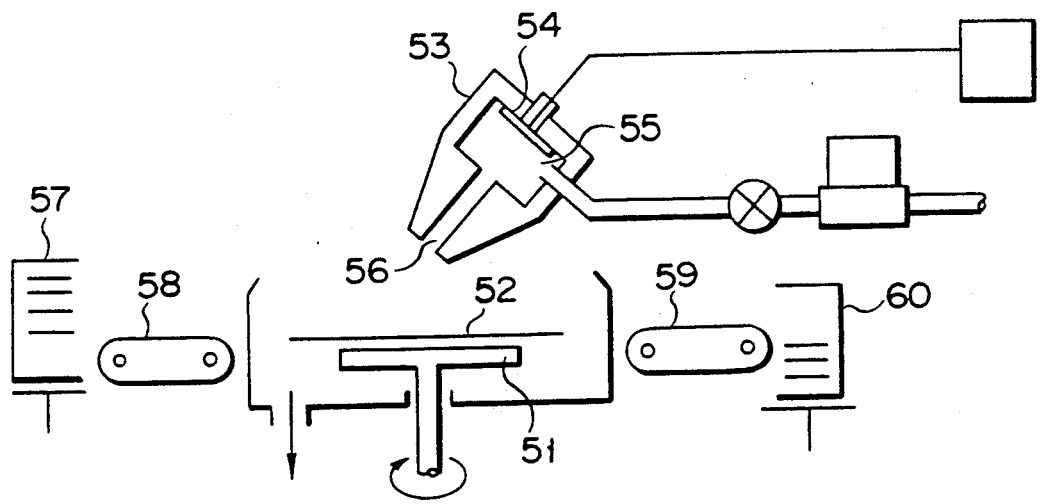
F I G. 1
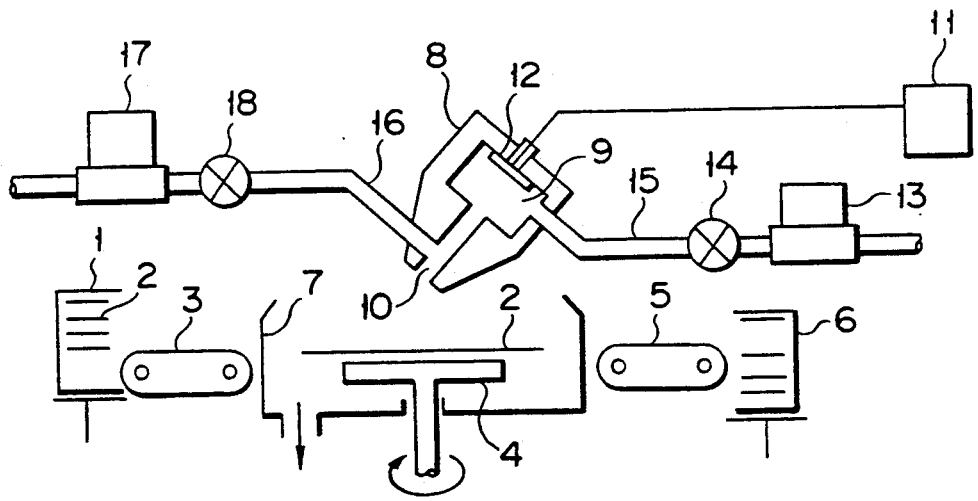
F I G. 2

METHOD AND APPARATUS FOR CLEANING SEMICONDUCTOR DEVICES

BACKGROUND OF THE INVENTION

1. Field of the Invention

The present invention relates to a method and apparatus for cleaning semiconductor devices and, more particularly, to a method and apparatus for cleaning semiconductor devices using an ultrasonic pure water (to be referred to as megasonic pure water) added with an alkaline or acidic chemical.

2. Description of the Related Art

Interelement wiring gaps in semiconductor devices have been reduced along with an increase in their integration, and a term "0.5-$\mu$m rule" is often in recent years. For this reason, foreign substances, i.e., dust formed during the manufacture cannot be neglected and may give a substantial influence on a product yield. Various improvements have been made in cleaning in the manufacturing process to minimize the amount of dust produced in the manufacturing stages.

In addition to a conventional cleaning method using a pure water flow, a megasonic pure water cleaning method is also utilized. When a megasonic pure water cleaning apparatus is used, a frequency range of very short vibration wavelengths of 800 kHz to 2 MHz is used and even fine particles can be efficiently removed. In addition, no cavitation occurs, and the damage to the semiconductor substrate can be prevented.

However, when RIE (Reactive Ion Etching) or CDE (Chemical Dry Etching) is performed to etch an Al or Al alloy wiring layer or an $SiO_2$ or P-SiN (Plasma-SiN) insulating film by using a resist, and the resist is then removed by the oxygen plasma method, a resist residue and a heavy metal residue left in the above process cannot be removed by megasonic pure water cleaning. Therefore, a post treatment such as a treatment with an alkaline solution such as a choline solution or an acidic solution such as a hydrofluoric acid or sulfuric acid solution is required after megasonic pure water cleaning is performed.

Since the post treatment is performed by a dip method, particles floating on the surface of the solution by a surface tension may be attached to the cleaned semiconductor substrate again.

SUMMARY OF THE INVENTION

It is the first object of the present invention to provide a cleaning apparatus capable of removing a heavy metal residue which cannot be removed by megasonic cleaning and a resist residue after a resist is removed by an oxygen plasma.

It is the second object of the present invention to provide a cleaning method capable of removing a heavy metal residue which cannot be removed by megasonic cleaning and a resist residue after a resist is removed by an oxygen plasma.

In order to achieve the first object of the present invention, there is provided an apparatus for cleaning semiconductor devices, comprising:
 a support;
 a semiconductor substrate placed on the support so as to be cleaned;
 ultrasonic generating means for applying ultrasonic vibrations to pure water supplied to the apparatus; and
 means for mixing a predetermined chemical to the pure water applied with the ultrasonic vibrations from the ultrasonic generating means and supplying a desired pure water solution to the semiconductor substrate.

In order to achieve the second object of the present invention, there is provided a method of cleaning semiconductor devices, comprising the steps of:
 preparing a support;
 placing a target semiconductor substrate to be cleaned on the support;
 applying ultrasonic vibrations to pure water; and
 mixing a predetermined chemical with the pure water applied with the ultrasonic vibrations and supplying a desired pure water solution to the semiconductor substrate.

BRIEF DESCRIPTION OF THE DRAWINGS

FIG. 1 is a sectional view showing a main part of a conventional megasonic pure water cleaning apparatus;

FIG. 2 is a sectional view showing a main part of a cleaning apparatus according to the first embodiment of the present invention;

DETAILED DESCRIPTION OF THE PREFERRED EMBODIMENTS

Figure 3:
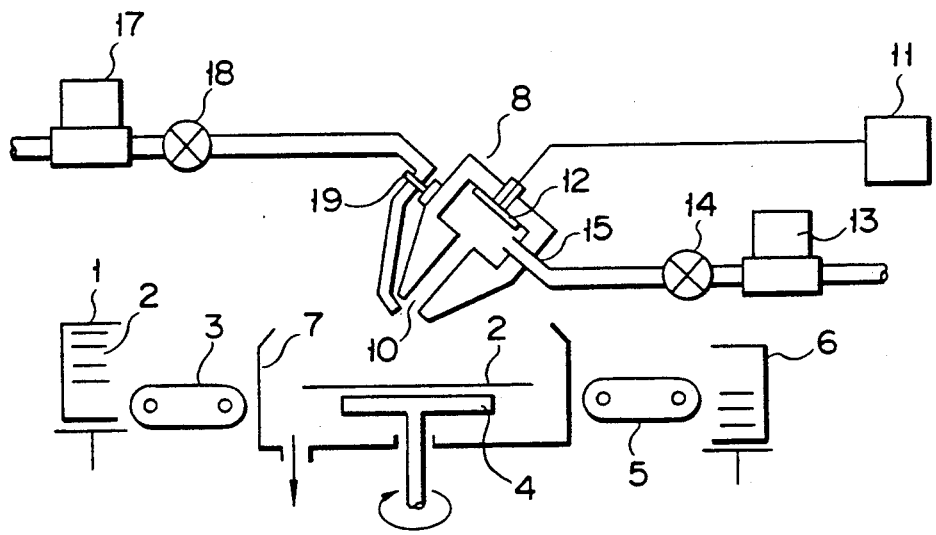
FIG. 3 is a sectional view showing a main part of a cleaning apparatus according to the second embodiment of the present invention.

FIG. 1 is a view showing a conventional megasonic pure water cleaning apparatus. This apparatus is of a so-called spinner type in which a semiconductor substrate 52 fixed on a rotatable support 51 is cleaned.

A nozzle 53 for spraying pure water opposes the semiconductor substrate 52.

Passive or active elements are formed on one surface of the semiconductor substrate 52 to which pure water is sprayed. During cleaning, a pure water jet is also sprayed to the opposite surface, i.e., the lower surface of the semiconductor substrate, thereby simultaneously performing a back rinse operation.

A tantalum vibrator 54 is arranged in a vibration chamber 55 which is formed in the nozzle 53 to store pure water. An outlet path 56 is formed to communicate with the vibration chamber 55. Megasonic pure water is sprayed from the vibration chamber 55 to the semiconductor substrate 52 fixed on the support 51. Prior to the operation of the cleaning apparatus described above, the semiconductor substrate 52 is stored in a loader 57 and is set on the support 51 through a convey path 58. When a predetermined cleaning operation is completed, the semiconductor substrate 52 is transferred to an unloader 60 through a convey path 59.

The support 51 on which the semiconductor substrate 52 is fixed is rotated at a speed falling within the range of 1 to 3,000 rpm. And, a predetermined ultrasonic vibration is given, which is selected from the range of 800 kHz to 2 MHz, to the pure water supplied to the vibration chamber 55 upon operation of the tantalum vibrator 54. The resultant megasonic pure water is sprayed from the outlet path 56 for 5 to 60 seconds at a flow rate of 0.5 to 2 l/min.

When spraying of the megasonic pure water to the semiconductor substrate is completed, the support 51 is rotated at a speed of 3,000 to 5,000 rpm to perform spin drying, thereby completing the cleaning operation.

In addition to this cleaning operation, a technique is also known to remove foreign substances such as dust by dipping a semiconductor substrate in a chemical solution. The chemical solution may be an acidic solution such as hydrogen peroxide, a hydrophilic surfactant, hydrofluoric acid, and sulfuric acid, a strong basic solution such as a choline solution, and a mixture thereof.

In the spinner type megasonic pure water cleaning apparatus, since the range of very short wavelengths such as 800 kHz to 2 MHz is used, the following effects can be obtained (1) Even small particles can be efficiently removed For example, an average removal rate of 90% of CVD (Chemical Vapor Deposition) particles in megasonic pure water cleaning at a power of 100 W, a support speed of 50 rpm, a flow rate of 1l/min and a cleaning time of 30 seconds is about 1.4 times the average removal rate of 65% in normal wafer flow cleaning at a flow rate of 4l/min and a cleaning time of 15 minutes.

(2) Since cavitation does not occur, the damage to the semiconductor substrate can be eliminated, thus providing fundamental advantages.

As compared with a batch scheme, a special conveying means can be omitted. The cassette-to-cassette method allows in-line handling, and the operation time can be shortened. In addition, pure water consumption per semiconductor substrate ca be reduced.

Assume that RIE (Reactive Ion Etching) or CDE (Chemical Dry Etching; a method using radicals moved to a location away from a plasma generation position by using a magnetron tube) is performed to etch an Al or Al alloy wiring layer or an SiO$_2$ or P-SiN (Plasma-SiN) insulating film by using a resist, and that the resist is then removed by the oxygen plasma method. In this case, a resist residue and a heavy metal residue left in the above process cannot be removed by megasonic pure water cleaning.

Therefore, a post treatment such as a treatment with an alkaline solution such as a choline solution or an acidic solution such as a hydrofluoric acid or sulfuric acid solution is required after megasonic pure water cleaning is performed.

Since the post treatment is performed by a dip method, particles floating on the surface of the solution by a surface tension may be attached to the cleaned semiconductor substrate again.

A cleaning apparatus according to the present invention will be described below.

The present invention has been made based on the findings wherein a metal or other residue produced by RIE of a wiring layer (e.g., an Al, Al-Si, or Al-Si-Cu wiring layer) or P-SiN or a resist residue produced by removing a resist by an oxygen plasma upon etching of a silicon substrate by a CDE using a resist pattern can be removed by megasonic pure water cleaning using a chemical mixture. The floating metal components and the floating resist residue are caused to flow out.

The residue removal step can be eliminated, and equipment cost and maintenance expenses can be greatly reduced.

In order to practice the above principle, in the cleaning apparatus, a target semiconductor substrate is placed on a rotatable support. An ultrasonic vibration chamber for storing pure water and an ultrasonic vibration plate are arranged in a nozzle opposite to the semiconductor substrate. In addition, an outlet path is formed in the ultrasonic vibration chamber, and a chemical/pure water mixing mechanism is arranged to homogeneously mix megasonic pure water flowing out from the vibration chamber with a chemical.

A material for the nozzle must have resistance to chemicals. When the cleaning solution is a choline solution, a fluoroplastic material is used as the nozzle material.

Chemicals used in the present invention can be an acidic solution (e.g., hydrofluoric or sulfuric solution) and a basic solution (e.g., a choline solution). The chemicals are used not to dissolve the residue but to separate it from the surface of the semiconductor substrate. Therefore, a choline content can be 1 volume % (to be referred to as vol % hereinafter) or less or may be 0.1 vol % in some cases.

A preferred embodiment of the present invention will be described with reference to FIGS. 2 and 3. That is, a target semiconductor substrate 2 stored in a loader 1 is conveyed by a convey system 3 called frog legs and is fixed on a support 4. When megasonic pure water cleaning (to be described later) is completed, the cleaned semiconductor substrate 2 is conveyed by a convey system 5 called frog legs and stored in an unloader 6.

The size of the semiconductor substrates 2 in the loader 1 and unloader 6 and that of the semiconductor substrate 52 on the support 4 are different from each other for illustrative convenience, but they have the same size.

In order to fix the target semiconductor substrate 2 on the support 4, a mechanical structure (not shown) is required. Six split grippers are arranged in the support 4, and three of them are rotated upon rotation of the support, thereby firmly fixing the target semiconductor substrate 2 on the support 4.

A wall 7 is formed around the support 4 in FIGS. 2 and 3 to prevent the pure water flowing in the cleaning operation from being scattered and to guide the pure water to an external reservoir. Although not illustrated, a back rinse operation is performed to spray a pure water jet to the lower surface of the target semiconductor substrate 2.

A nozzle 8 is made of a fluoroplastic material having resistance to alkalis and acids and includes an ultrasonic vibration chamber 9 for storing megasonic pure water and generating ultrasonic vibrations, and an outlet path 10 which communicates with the ultrasonic vibration chamber 9.

A tantalum vibrator 12 electrically connected to a power source 11 is arranged in the ultrasonic vibration chamber 9, and megasonic pure water is supplied to the ultrasonic vibration chamber 9 through a pure water flow control system 13, a valve 14, and a conduit 15. The ultrasonic vibration chamber 9 generates vibrations having a frequency range of 800 kHz to 2 MHz upon operation of the tantalum vibrator 12, thereby obtaining megasonic pure water.

Reference numerals 16, 17, and 18 denote components constituting a chemical solution supply portion as a characteristic feature of the present invention. More specifically, as shown in FIG. 2, a chemical solution supply conduit 16 is arranged through a chemical solution flow control system 17 and a valve 18. The distal end of the chemical solution supply conduit 16 is formed in the nozzle 8.

As shown in FIG. 3, however, the chemical solution supply conduit 16 may be fixed to the nozzle 8 by a mechanical means such as a pendulum 19, and the distal end of the conduit 16 can be guided outside the outlet path 10. With this arrangement, a mixture of pure water and a chemical can be supplied onto the semiconductor substrate 2.

In either method, a chemical is mixed in the pure water after the ultrasonic vibrations having the frequency range described above are applied to the pure water, and thus the tantalum vibrator 12 is prevented from being corroded by a treatment solution such as an alkaline solution, a hydrofluoric acid solution, and a hydrogen peroxide solution. By employing the above method, elution of tantalum and impurities contained in the tantalum vibrator 12 by the strong alkaline solution or the hydrofluoric acid solution in a concentration of several tens to several hundreds of ppm, mixing of tantalum and the impurities into the megasonic pure water, and contamination of the semiconductor substrate 2 can be prevented.

A means for mixing the chemical with the megasonic pure water is a fixed outlet path 10 used in the apparatus shown in FIG. 2. However, the apparatus of FIG. 3 employs a movable scheme in which the chemical solution supply conduit 16 is arranged outside the outlet path 10. A mixing ratio of a chemical to pure water is adjusted by the flow control systems 13 and 17. If choline is used, its content must be set to 1 vol % or less. When an acidic solution such as a hydrofluoric acid solution and sulfuric acid is used, it is used in the same content as choline.

Although it depends on the operating state of the tantalum vibrator 12 in the ultrasonic vibration chamber 9 filled with pure water, a flow rate of the cleaning megasonic pure water is preferably about 1 l/min. Depending on the type of target object such as a heavy metal a resist, maximum and minimum periods of the cleaning time are 1 minute and about 10 seconds, respectively.

Active and passive elements are formed near the surface of the target semiconductor substrate 2. Patterning of an Al, Al-Si, or Al-Si-Cu deposition layer electrically connected to each element is performed by RIE using a positive photoresist.

An operating mechanism of the nozzle 8 including the ultrasonic vibration chamber 9 is not illustrated in FIGS. 2 and 3. The following two systems may be employed. First, a mechanism (e.g., a pinion gear is mounted on a fixing portion (not shown) of the nozzle 8) is arranged to be radially movable by only a radius of the semiconductor substrate 2 fixed on the rotatable support 4 and cleaned with pure water mixed with a chemical. For this reason, ultrasonic cleaning of the entire surface of the semiconductor substrate 2 can be performed upon rotation of the support 4. Therefore, the operation of the nozzle 8 in a predetermined direction can be compensated by the above mechanism.

Second, there is a method of arranging the nozzle 8 on a mechanism movable in the X-Y plane. While the semiconductor substrate 2 is being moved in one direction, e.g., the X direction, the pure water mixed with a chemical is moved in the other direction, e.g., the Y direction, thereby performing ultrasonic cleaning. In this case, a rotary mechanism need not be arranged in the support 4.

In order to determine best cleaning conditions for the manufacturing process, a cleaning effect of a photoresist residue left on an Al or Al alloy wiring layer was examined after an Al or Al alloy wiring pattern formed on a silicon substrate was etched by RIE using a positive photoresist and the positive photoresist layer was peeled by an oxygen plasma method.

In addition, 0.5 vol % of choline were added to megasonic pure water obtained by applying ultrasonic vibrations to the pure water under conditions that a frequency was 1.0 MHz, a power was 100 W, and a flow rate was 1 l/min to prepare a treatment solution. The support 4 on which the silicon substrate 2 was fixed was rotated at a speed of 50 rpm, and cleaning was performed at a flow rate of 1 l/min. Thereafter, while the support was kept rotated at 50 rpm, pure water which did not receive ultrasonic vibrations and was sprayed from another nozzle was used to clean the silicon substrate 2 for one minute. The silicon substrate was then spin-dried at 5,000 rpm.

Figure 4:
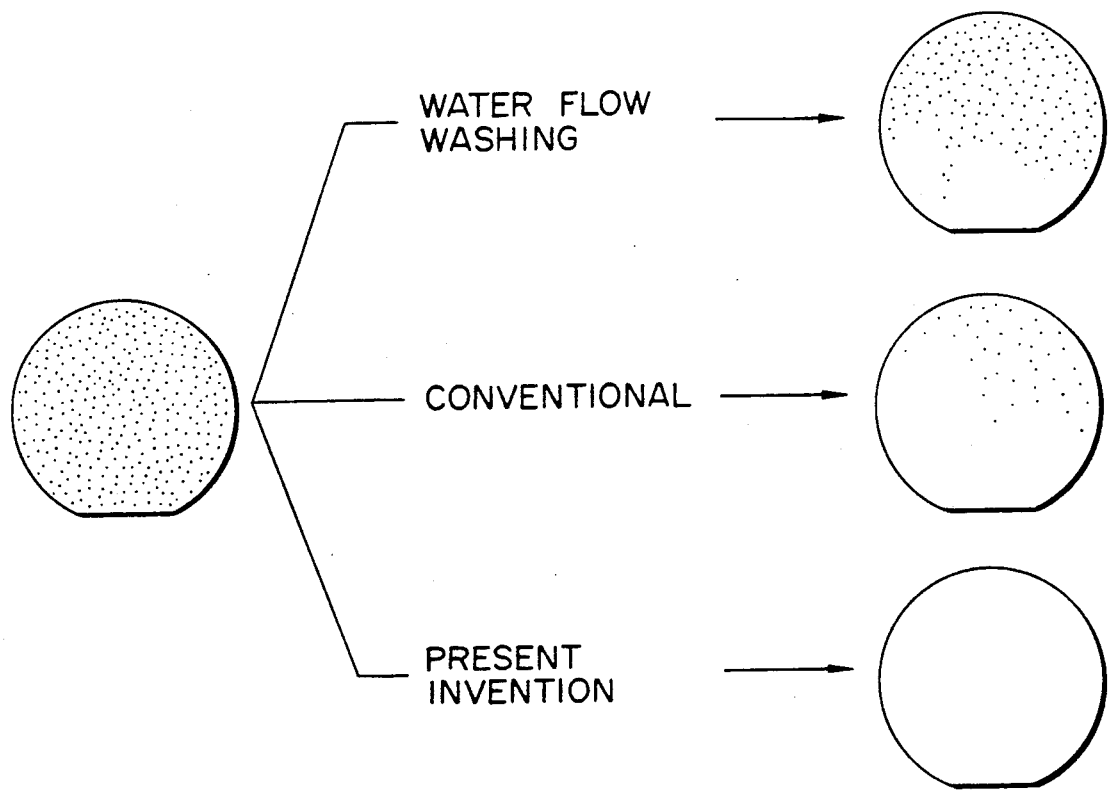
FIG. 4 is a view for explaining an effect of a cleaning method of the present invention.

As can be apparent from FIG. 4, the number of particles left by water flow cleaning is large, the number of particles left by conventional megasonic pure water cleaning is medium, and the number of particles left by the method of the present invention is small. The silicon substrate prior to cleaning has the largest number of particles. More specifically, the average particle removal rate obtained by using only pure water was 90%, and the average particle removal rate obtained by the method of the present invention in which 0.5 vol% of a chemical are added can be improved to 95% to 98%. In addition, a resist residue removal state was examined with SEM observation, and it was found that the resist residue was removed together with heavy metal particles. The shape of the nozzle is not limited to the specific one exemplified in the above embodiment when an acidic or alkaline solution can be mixed with pure water upon application of ultrasonic vibrations to the pure water. The residue to be removed is exemplified by a resist residue and a heavy metal residue upon formation of an Al wiring layer. However, residues may include a resist residue upon formation of a polycrystalline semiconductor layer (e.g., polysilicon layer) pattern, a resist residue upon formation of an insulating film such as an $SiO_2$ film, an a residue such as a polymer or heavy metal residue except for the resist residue, which cannot be removed by pure water ultrasonic cleaning.

The treatment solution is not limited to the conditions (e.g., a concentration and cleaning conditions) of the above embodiment, but can be extended to caustic soda except for choline as an alkaline solution, a hydrofluoric acid solution effective for the residue after P-SiO etchback, and a sulfuric acid solution effective for a positive resist residue upon polysilicon patterning if the treatment solution is effective for the target residue.

According to the cleaning apparatus and its method, the heavy metal and resist residue which are deposited on an Al wiring layer or the like can be removed. The resist residue removal step which is required in the conventional fabrication process can be omitted. Therefore, manufacturing cost which results from a decrease in the number of manufacturing steps and equipment cost and maintenance expenses which result from omission of equipment can be achieved.

What is claimed is:

1. An apparatus for cleaning semiconductor devices, comprising:
   a support upon which the devices can be held;
   means for flowing a liquid toward said support, including means for introducing a flow of pure water;
   means for applying ultrasonic vibrations to the pure water from the flowing means; and
   means for mixing a predetermined chemical with the pure water downstream from the ultrasonic vibrations applying means to produce the liquid and for allowing the liquid to flow toward the support.

2. An apparatus according to claim 1, wherein said ultrasonic vibrations applying means comprises a vibrator, a power source for applying a predetermined voltage to said vibrator, and an ultrasonic vibration chamber in which said vibrator is arranged.

3. An apparatus according to claim 2, wherein said vibrator comprises a tantalum vibrator.

4. An apparatus according to claim 2, wherein said vibrator generates frequency vibrations falling within a range of 800 kHz to 2 MHz upon application of a voltage from said power source to said vibrator.

5. An apparatus according to claim 1, wherein said chemical solution mixing means comprises a chemical solution flow control system including a valve and a chemical solution supply conduit leading toward the flowing means.

6. An apparatus according to claim 1, wherein the predetermined chemical contains one of an acidic solution and choline in a basic solution.

7. An apparatus according to claim 6, wherein the predetermined chemical is 1 vol. % or less choline in the basic solution.

8. An apparatus according to claim 7, wherein a content of the choline is 0.1 vol %.

9. An apparatus according to claim 6, wherein the predetermined chemical is 1 vol. % or less acid in the solution.

10. An apparatus according to claim 1, wherein the flowing means, ultrasonic vibrations applying means and mixing means together include a nozzle for guiding the pure water applied with the ultrasonic vibrations toward the support, and the mixing means includes a chemical solution supply conduit fixed to the nozzle.

11. An apparatus according to claim 10, wherein the nozzle has an outlet and said chemical solution supply conduit is connected to the nozzle near the outlet.

12. An apparatus according to claim 10, wherein part of said chemical solution supply conduit is fixed to said nozzle by mechanical means.

13. An apparatus according to claim 12, wherein said mechanical means is a cantilevered arm.

14. A method of cleaning semiconductor devices, comprising the steps of:
placing one of the semiconductor devices to be cleaned on a support;
flowing a liquid, including flowing pure water, toward the semiconductor device; and
applying ultrasonic vibrations to the flowing pure water in a region;
the step of flowing a liquid including mixing a predetermined chemical with the flowing pure water down stream from the ultrasonic vibrations application region to produce the liquid and allowing the liquid to flow toward the support.

15. A method according to claim 14, wherein the predetermined chemical contains one of an acidic solution and choline in a basic solution.

16. A method according to claim 15, wherein the predetermined chemical is 1 vol. % or less choline in the basic solution.

17. A method according to claim 16, wherein a content of the choline is 0.1 vol. %.

18. A method according to claim 15, wherein the predetermined chemical is 1 vol. % or less acid in the solution.

19. An apparatus according to claim 9, wherein the content of acid is 0.1 vol. %.

20. A method according to claim 18, wherein the content of acid is 0.1 vol. %.

* * * * *